US009059152B2

(12) United States Patent
Inoue et al.

(10) Patent No.: US 9,059,152 B2
(45) Date of Patent: Jun. 16, 2015

(54) WIRING SUBSTRATE AND MANUFACTURING METHOD OF THE SAME

(71) Applicant: NGK SPARK PLUG CO., LTD., Nagoya-shi, Aichi-ken (JP)

(72) Inventors: Masahiro Inoue, Kounan (JP); Atsuhiko Sugimoto, Kagamigahara (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 24 days.

(21) Appl. No.: 13/659,147

(22) Filed: Oct. 24, 2012

(65) Prior Publication Data

US 2013/0100626 A1    Apr. 25, 2013

(30) Foreign Application Priority Data

Oct. 25, 2011  (JP) ................................. 2011-233720

(51) Int. Cl.
*H05K 1/11*  (2006.01)
*H05K 1/18*  (2006.01)
(Continued)

(52) U.S. Cl.
CPC ............ *H01L 21/4853* (2013.01); *H05K 1/118* (2013.01); *H05K 1/119* (2013.01); *H05K 3/34* (2013.01); *H05K 2201/09545* (2013.01); *H01L 23/49811* (2013.01); *H01L 23/49822* (2013.01); *H01L 2224/16225* (2013.01); *H01L 2224/32225* (2013.01); *H01L 2224/73204* (2013.01); (Continued)

(58) Field of Classification Search
CPC ................... H01L 2924/1517; H01L 21/4857; H05K 2201/10674; H05K 3/4007; H05K 2201/0367; H05K 3/429; H05K 1/0298; H05K 3/4647; H05K 2203/0733; H05K 2201/09827

USPC ................... 174/250–268; 361/760, 792–795; 257/778
See application file for complete search history.

(56) References Cited

U.S. PATENT DOCUMENTS 5,473,197 A * 12/1995 Idaka et al. .................... 257/786
6,624,512 B2 * 9/2003 Kurusu ........................ 257/737
(Continued)

FOREIGN PATENT DOCUMENTS

JP        7-211722 A      8/1995
JP     2000-294937 A    10/2000
(Continued)

OTHER PUBLICATIONS

Korean Industrial Property Office, Notification of Provisional Refusal, issued in corresponding Korean Patent Application No. 10-2012-0118301, issued Oct. 28, 2014.
(Continued)

*Primary Examiner* — Ishwarbhai B Patel
(74) *Attorney, Agent, or Firm* — Stites & Harbison PLLC; Jeffrey A. Haeberlin; James R. Hayne

(57) ABSTRACT

Embodiments of the present invention provide a wiring substrate having a structure where a plurality of projection electrodes are arranged within an electrode formation region on a substrate main surface. At least one among a plurality of the projection electrodes is a variant projection electrode which has a recess portion on an upper surface, an outer diameter at the upper end that is larger than an outer diameter at the lower end, and a reverse trapezoidal cross-section shape. Embodiments of the present invention also provide methods for manufacturing wiring substrates having one or more of said variant projection electrode.

7 Claims, 14 Drawing Sheets

(51) Int. Cl.
*H05K 3/34* (2006.01)
*H01L 21/48* (2006.01)
*H01L 23/498* (2006.01)
*H01L 23/00* (2006.01)

(52) U.S. Cl.
CPC ............... *H01L2924/15311* (2013.01); *H01L 2924/01322* (2013.01); *H01L 24/13* (2013.01); *H01L 24/16* (2013.01); *H01L 24/17* (2013.01); *H01L 24/81* (2013.01); *H01L 2224/17051* (2013.01); *H01L 2224/81385* (2013.01); *H01L 2224/81444* (2013.01); *H01L 2224/81815* (2013.01); *H01L 2224/81193* (2013.01); *H01L 2924/1461* (2013.01)

(56) References Cited

U.S. PATENT DOCUMENTS 6,683,387 B1 * 1/2004 Brownfield .................. 257/786
8,476,536 B2 * 7/2013 Kaneko et al. ............... 174/262
2004/0102037 A1 5/2004 Tanida et al.
2006/0011382 A1 1/2006 Miura
2006/0194367 A1 8/2006 Tanida et al.
2008/0106880 A1 5/2008 Miura
2008/0149383 A1 6/2008 Kaneko et al.
2010/0236822 A1 9/2010 Furutani et al.

FOREIGN PATENT DOCUMENTS

JP 2004-158701 A 6/2004
JP 2010-226075 A 10/2010
TW 200417016 9/2004
TW 200504899 2/2005

OTHER PUBLICATIONS

Taiwan Intellectual Property Office, Notification for the Opinion of Examination, issued in corresponding Taiwan Patent Application No. 101139169, mailed Mar. 6, 2015.

* cited by examiner

WIRING SUBSTRATE AND MANUFACTURING METHOD OF THE SAME

CROSS REFERENCE TO RELATED APPLICATIONS

The present application claims priority from Japanese Patent Application No. 2011-233720, which was filed on Oct. 25, 2011, the disclosure of which is herein incorporated by reference in its entirety.

BACKGROUND OF THE INVENTION

1. Field of the Invention

The present invention relates to a wiring substrate where a plurality of projection electrodes are arranged within an electrode formation region on a substrate main surface, and to a manufacturing method for the same.

2. Description of Related Art

In the related art, a wiring substrate (i.e., semiconductor package) formed by installing a component such as an IC chip is well known. Here, as a structure for enabling electrical connection to the IC chip, it has been proposed that a solder bump be formed on a plurality of connecting terminals arranged at the bottom surface side of the IC chip or on a pad (i.e., C4 pad: Controlled Collapsed Chip Connection Pad) which is a plurality of projection electrodes arranged on a substrate main surface of the wiring substrate. For example, see JP-A-2010-226075, specifically FIG. 19A and the like, and JP-A-1995-211722, specifically FIG. 4 and the like.

BRIEF SUMMARY OF THE INVENTION

However, there is concern about an IC chip sliding off a pad due to a slip (e.g., misalignment) during the IC chip installation since the pad projects from the main surface of a substrate. As a result, a connection failure (e.g., open failure, short-circuit failure and the like) may occur between the individual pad and the IC chip. Therefore, there is concern about degradation of the reliability of the wiring substrate since the manufactured wiring substrate becomes defective.

The present invention is made in the light of the above-described problem and a primary object is to provide a wiring substrate which enables reliability to be improved by preparing a projection electrode suitable for connection to a component. In addition, a secondary object is to provide a desirable manufacturing method for obtaining the above-described excellent wiring substrate.

As means (means 1) for solving the above-described problem, there is provided a wiring substrate that comprises a multilayer portion that includes a plurality of interlayer insulation layers, a top-most interlayer insulation layer constituting a substrate main surface, and a plurality of projection electrodes arranged within an electrode formation region on the substrate main surface. At least one among the plurality of projection electrodes comprises a variant projection electrode having a recess portion on the upper surface, an outer diameter at an upper end that is larger than an outer diameter at the lower end, and a reverse trapezoidal cross-sectional shape.

Therefore, according to the wiring substrate of the means 1, at least one among a plurality of the projection electrodes is formed as a variant projection electrode which has the recess portion on the upper surface. Consequently, if a structure (for example, a connecting terminal arranged at the bottom surface side of a component, a solder bump formed on the connecting terminal or the like) arranged at the bottom surface side of the component is placed on the variant projection electrode, at least a portion of the structure is fitted into the recess portion. As a result, since misalignment of the structure is prevented by the structure coming into contact with the inner surface of the recess portion, it is possible to prevent in advance the component from falling away from a plurality of the projection electrodes and to prevent a connection failure between the individual projection electrodes and the component. That is, it is possible to improve reliability of the wiring substrate by providing the projection electrode suitable for being connected to the component. In addition, since the outer diameter at the upper end of the variant projection electrode is set to be larger than the outer diameter at the lower end of the variant projection electrode, it is easy to secure the contact area between the variant projection electrode and the structure at the component side. As a result, the misalignment of the structure at the component side is more reliably prevented and consequently the reliability of the wiring substrate can be further improved.

The wiring substrate may be formed from any arbitrary material without being specifically limited, but for example, a resin substrate or the like is preferable. The preferable resin substrate includes a substrate formed from EP resin (epoxy resin), PI resin (polyimide resin), BT resin (bismaleimide-triazine resin), PPE resin (polyphenylene ether resin) or the like. In addition, a substrate formed from a composite material of the resin and glass fibers (glass woven fabric or glass non-woven fabric) may be used. As a specific example, there is a multilayer plate having high thermal resistance, such as a glass-BT composite substrate, a high Tg glass-epoxy composite substrate (FR-4, FR-5 and the like) or the like. Furthermore, a substrate formed from composite material of the resin and organic fibers, such as polyamide fibers, may be used. Furthermore, a substrate formed from resin-resin composite material where thermosetting resin, such as epoxy resin impregnated in three-dimensional network-type fluorine-based resin base material such as continuous porous material PTFE, may be used. As another material, for example, it is possible to select various ceramics or the like. In addition, the structure of the relevant wiring substrate is not specifically limited, but it is possible to exemplify a buildup multilayer wiring substrate which has a buildup layer on one side or both sides of a core substrate, and a coreless wiring substrate which has no core substrate or the like.

The position and the number of the electrode formation regions on the substrate main surface are arbitrary without being specifically limited. However, for example, in a case of a so-called multi-cavity substrate, the electrode formation regions are present in numbers corresponding to the number of the cavities of the wiring substrate. The electrode formation region may be present only on the top (first) main surface of the wiring substrate, but may be present at the other main surface (e.g., bottom (second) main surface).

In addition, the projection electrode (including the variant projection electrode) can be formed from conductive metal material or the like. As the metal material configuring the projection electrode, for example, copper, silver, iron, cobalt, nickel and the like are exemplified. In particular, it is preferable to form the projection electrode using copper which is highly conductive and which has low cost. In addition, it is good to form the projection electrode by plating. In such a case, the projection electrode can be uniformly formed with high accuracy. In contrast, if the projection electrode is formed using reflow of metallic paste, it is difficult to uniformly form the projection electrode with high accuracy. Accordingly, there is concern about variations occurring in the height of each projection electrode.

The variant projection electrode has a recess portion on the upper surface. The depth of the recess portion is arbitrary without being specifically limited, but for example, is preferably equal to or more than 1% of the height of the variant projection electrode. Assuming the depth of the recess portion is less than 1% of the height of the variant projection electrode, even though at least a portion of the above-described structure is fitted into the recess portion, it is difficult to prevent misalignment of the structure. Therefore, there is a possibility of the component not being prevented from falling out of a plurality of the projection electrodes. In addition, it is preferable that the entire inner surface of the recess portion has a curved surface shape and the deepest portion of the recess portion is located on the center axis of the variant projection electrode. That is, since the entire inner surface of the recess portion has a curved surface shape, the structure is guided to the deepest portion of the recess portion when the above-described structure is fitted into the recess portion. Further, since the deepest portion is located on the center axis of the variant projection electrode, the positioning of the structure can be exactly performed by fitting the structure into the recess portion.

In addition, it is preferable to form a curved portion at the boundary area between the upper surface of the variant projection electrode and the lateral surface of the variant projection electrode. If the curved portion is provided, even though thermal stress is applied to an under filling in a case where the under filling is filled between the wiring substrate and the above-described component, stress concentration on the boundary area between the upper surface of the variant projection electrode and the lateral surface of the variant projection electrode is relieved. Consequently, it is possible to reliably prevent the occurrence of cracking at the under filling.

In addition, the plurality of projection electrodes can be arranged outside or within the electrode formation region, and it is preferable that all the projection electrodes which are present within the electrode formation region be variant projection electrodes. In such a case, since it is possible to prevent the misalignment of the above-described structure by the multiple variant projection electrodes, it is possible to more reliably prevent the component from falling out of a plurality of the projection electrodes. However, specifically in a case where a plurality of the projection electrodes are arrayed in vertical and horizontal rows along the surface direction of the substrate main surface in the electrode formation region, among a plurality of the projection electrodes, only the projection electrode positioned at the outer periphery of the electrode formation region may be the variant projection electrode. In this case, the projection electrode positioned at the region other than the outer periphery of the electrode formation region can become the electrode whose outer diameter at the upper end is set to be equal to the outer diameter at the lower end, and therefore, can be formed to be smaller than the variant projection electrode. Consequently, the pitch of the projection electrode can be further miniaturized.

In addition, the use of the variant projection electrode is not limited, but for example, the variant projection electrode may preferably be the projection electrode which is in a flip chip interconnection with a plurality of connecting terminals arranged at the bottom surface side of a component via a plurality of solder bumps placed on the recess portion, which can be applied through heating and melting. That is, it is necessary that the projection electrode for the flip chip interconnection be formed to be small corresponding to miniaturizing of a so-called C4 pad. Accordingly, in a case where the projection electrode is in the flip chip interconnection, the characteristic problem of decreased reliability of the wiring substrate due to the falling of the component in the present invention easily occurs, and this is the reason why the significance of adopting the above-described means 1 increases.

In addition, it is preferable that the outer diameter of the variant projection electrode at the upper end is from 1.1 times to 2.0 times the outer diameter at the lower end. In this case, it is possible to relatively easily form a small solder bump corresponding to miniaturizing of C4 pad. Assuming the outer diameter at the upper end is less than 1.1 times the outer diameter at the lower end, it is difficult to secure the contact area between the variant projection electrode and the structure at the component side. Accordingly, the above-described characteristic problem easily occurs, such as decreased reliability of the wiring substrate due to the falling of the component. On the other hand, if the outer diameter at the upper end becomes larger than 2.0 times the outer diameter at the lower end, each of the adjacent variant projection electrodes has a tendency to come into contact with each other. Therefore, it is difficult to miniaturize the pitch between the variant projection electrodes.

The solder material for the solder bump is not specifically limited, but for example, tin-lead eutectic solder (Sn/37Pb: melting point 183° C.) is used. Sn/Pb based solder other than tin-lead eutectic solder, for example, solder the composition of which is Sn/36Pb/2Ag (melting point 190° C.) may be used. In addition to the solder containing lead as described above, lead-free solder such as Sn—Ag based solder, Sn—Ag—Cu based solder, Sn—Ag—Bi based solder, Sn—Ag—Bi—Cu based solder, Sn—Zn based solder and Sn—Zn—Bi based solder can be selected.

In addition, a preferable component for connection to the projection electrode can include, but is not limited to, a capacitor, a resistor, a semiconductor integrated circuit device (IC chip), or MEMS (Micro Electro Mechanical Systems) produced in the semiconductor manufacturing process. Furthermore, as the IC chip, it is possible to exemplify DRAM (Dynamic Random Access Memory), SRAM (Static Random Access Memory) and the like. Herein, the "semiconductor integrated circuit device" means a device mainly used as the microprocessor of a computer or the like.

As the other means (means 2) in order to solve the above-described problem, a method of manufacturing a wiring substrate includes preparing the multilayer portion formed by layering a plurality of interlayer insulation layers; forming a resist on a top-most interlayer insulation layer that forms a substrate main surface; forming an opening on the resist which has a larger inner diameter at an upper end side of the opening than an inner diameter at a lower end side of the opening; and forming the variant projection electrode, which has a recess portion on an upper surface of the variant projection electrode, at the opening by plating the inner side of the opening.

Therefore, according to the method of manufacturing the wiring substrate of the means 2, the variant projection electrode which has the recess portion on the upper surface is formed by performing the step of forming the variant projection electrode. Accordingly, if the structure (for example, the above-described connecting terminal, solder bump or the like) arranged at the bottom surface side of the component is placed on the variant projection electrode, at least a portion of the structure is fitted into the recess portion. As a result, since the structure comes into contact with the inner surface of the recess portion, misalignment of the structure is prevented. Therefore, it is possible to prevent in advance the component from falling out of a plurality of the projection electrodes and consequently it is possible to prevent connection failure between the individual projection electrodes and the component. That is, since it is possible to manufacture the wiring substrate which has the projection electrode suitable for being connected to the component, reliability on the wiring substrate can be improved. In addition, in the step of forming the opening, the opening is formed such that the inner diameter of the upper end side opening is larger than the inner diameter of the lower end side opening. Therefore, in the step of forming the variant projection electrode, it is possible to form the variant projection electrode which is set to have the larger diameter at the upper end than the outer diameter at the lower end. Accordingly, it is easy to secure the contact area between the variant projection electrode and the structure at the component side. As a result, since the misalignment of the structure at the component side can reliably be prevented, the reliability on the wiring substrate can be further improved.

Hereinafter, the method of manufacturing the wiring substrate according to the means 2 will be described.

In the step of preparing the multilayer portion, the multilayer portion formed by layering a plurality of the interlayer insulation layers is prepared. The interlayer insulation layer can be arbitrarily selected in consideration of insulation properties, thermal resistance, humidity resistance and the like. As the preferable example of the material for forming the interlayer insulation layer, thermosetting resin such as epoxy resin, phenol resin, urethane resin, silicon resin and polyimide resin or thermoplastic resin such as polycarbonate resin, acrylic resin, polyacetal resin, and polypropylene resin may be exemplified. In addition, a composite material of the resin and organic fibers such as glass fibers (glass woven fabric or glass non-woven fabric) or polyamide fibers, or resin-resin composite material where thermosetting resin such as epoxy resin is impregnated in three-dimensional network-type fluorine-based resin base material such as continuous porous material PTFE may be used. Furthermore, a via hole may be formed at the interlayer insulation layer in advance in order to form the via conductor for interlayer connection.

In the step of forming the resist, the resist is formed on the top layer, or the interlayer insulation layer which has the substrate main surface, among a plurality of the interlayer insulation layers. In the subsequent step of forming the opening, the opening which is set to have a larger inner diameter of the upper end side opening than the inner diameter of the lower end side opening is formed. As the method of forming the opening, a method of forming the opening by performing a drilling work with respect to the resist, a method of forming the opening by performing a laser beam machining with respect to the resist, a method of forming the opening by performing exposure and development, and a method of forming the opening on the resist by punching the resist using a punching die are exemplified.

In the subsequent step of forming the variant projection electrode, the variant projection electrode is formed at the opening by plating the inner side of the opening. Through the above steps, the wiring substrate is manufactured.

In addition, after the step of forming the variant projection electrode, it is preferable to perform a step of forming a curved portion at the boundary area between the upper surface of the variant projection electrode and the lateral surface of the variant projection electrode by etching the variant projection electrode. If the curved portion is provided, even though thermal stress is applied to the under filling in a case where the under filling is filled between the wiring substrate and the above-described component, the stress concentration on the boundary area between the upper surface of the variant projection electrode and the lateral surface of the variant projection electrode is relieved. Consequently, it is possible to reliably prevent the occurrence of cracking at the under filling.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Hereinafter, an embodiment of the present invention will be described in detail with reference to the drawings.

Figure 1:
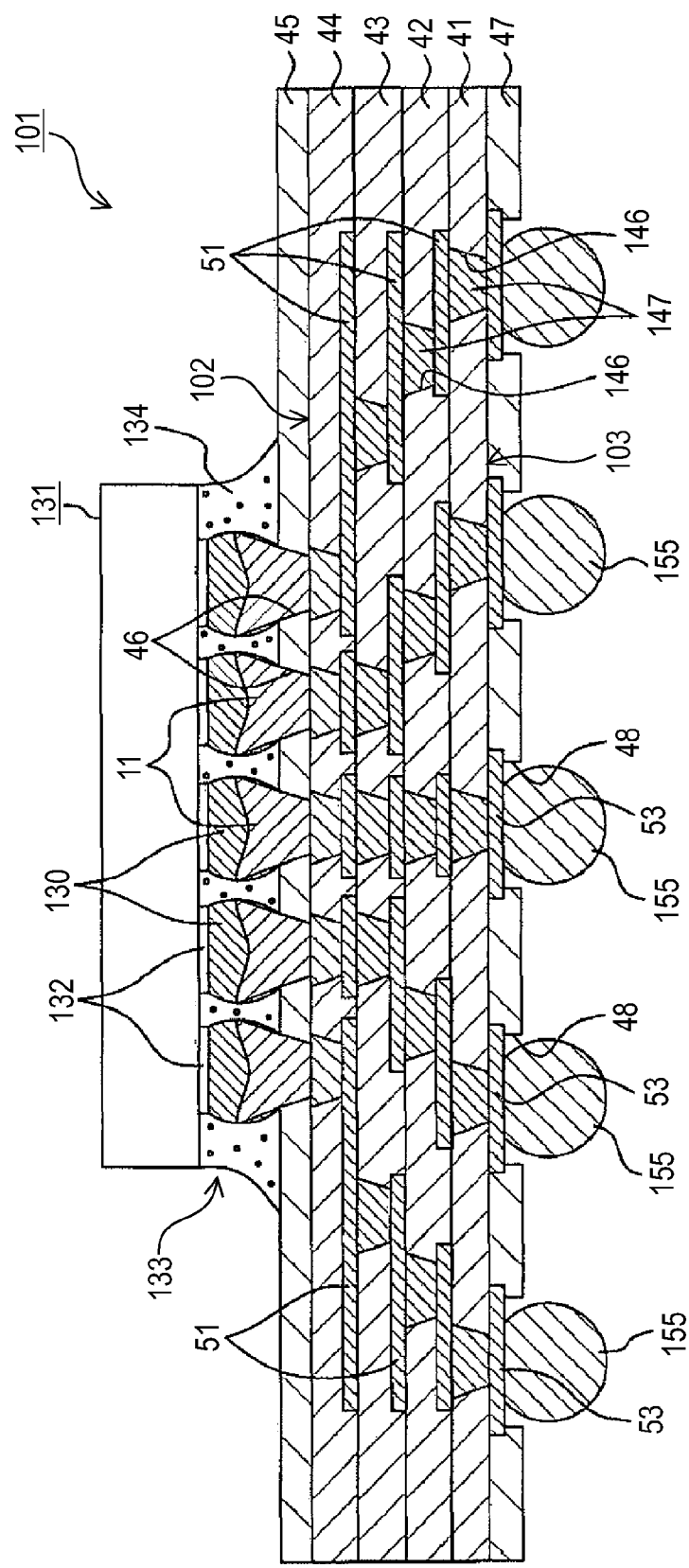
FIG. 1 is a schematic cross-sectional view illustrating a configuration of a coreless wiring substrate according to the present embodiment.

FIG. 1 is a schematic cross-sectional view illustrating a coreless wiring substrate 101 (wiring substrate) of the present embodiment. The coreless wiring substrate 101 does not have a core substrate and is a wiring substrate which has a structure where four layers of resin insulation layers 41, 42, 43 and 44 formed from epoxy resin and conductor layers 51 formed from copper are alternately layered. The resin insulation layers 41 to 44 are interlayer insulation layers which have the same thickness and are formed from the same material.

Furthermore, each of the resin insulation layers 41 to 44 respectively includes a via hole 146 and a via conductor 147. Each of the via holes 146 has a reverse truncated cone shape and is formed by drilling with respect to each of the resin insulation layers 41 to 44 using YAG laser or carbon dioxide laser. Each of the via conductors 147 is a conductor which has a diameter which expands in the same direction (upward in FIG. 1) and is mutually and electrically connected to each of the conductor layers 51.

As illustrated in FIG. 1, BGA pads 53 are arrayed on a second substrate main surface 103 (on the lower surface of the first layer, the resin insulation layer 41) of the coreless wiring substrate 101. In addition, the lower surface of the resin insulation layer 41 is almost entirely covered by the solder resist 47. The opening 48 which exposes the respective BGA pads 53 is formed at the solder resist 47. A plurality of solder bumps 155 which have a height of approximately 400 µm to 600 µm is arranged on the surface of the respective BGA pads 53. Each of the solder bumps 155 is a so-called BGA bump which is used for electrically connecting to a terminal at a motherboard (not illustrated) side.

Figure 2:
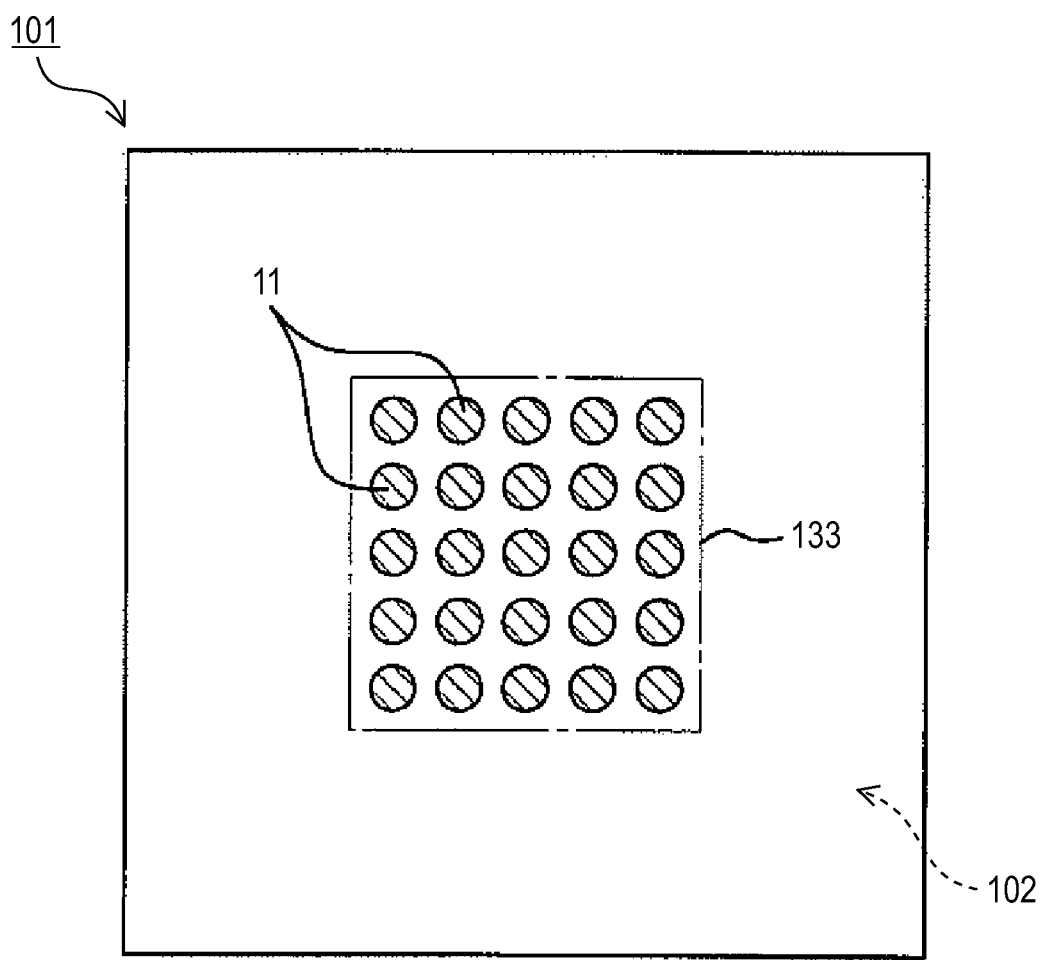
FIG. 2 is a schematic plan view illustrating the coreless wiring substrate.

On the other hand, as illustrated in FIG. 2, an electrode formation region 133 which has a substantially rectangular shape in planar view is set to be formed on a first substrate main surface 102 (on the surface of the top-most layer, the resin insulation layer 44) of the coreless wiring substrate 101. Then, a plurality of variant projection electrodes 11 are arranged vertically and horizontally along the surface direction of the first substrate main surface 102 within the electrode formation region 133. In the present embodiment, all projection electrodes which are present within the electrode formation region 133 become variant projection electrodes 11.

Figure 3:
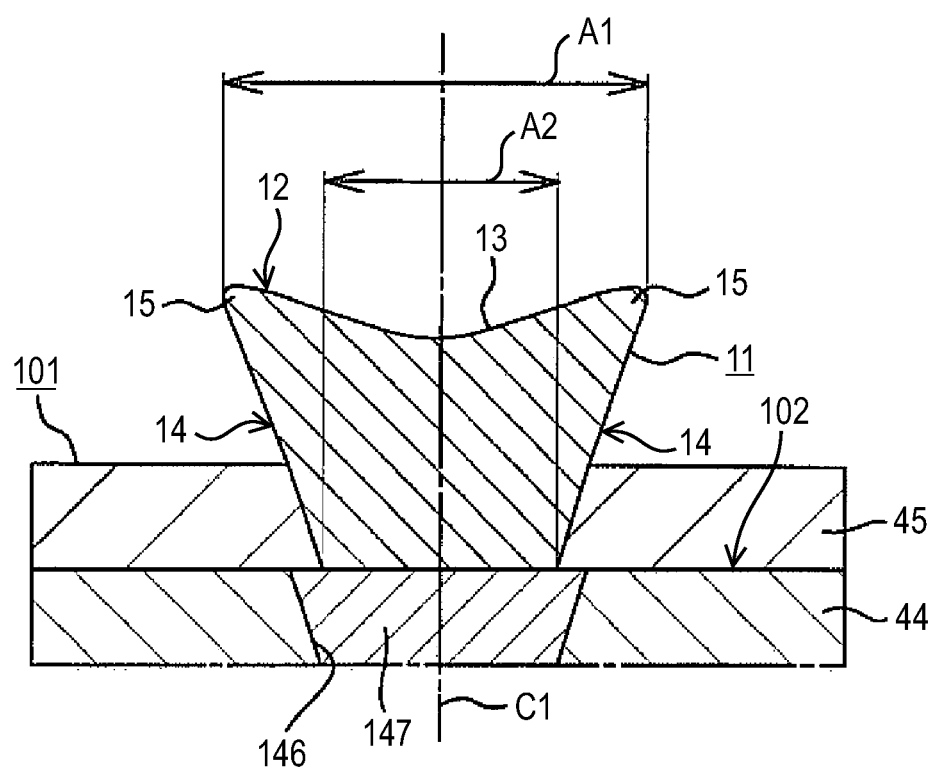
FIG. 3 is a cross-sectional view of a coreless wiring substrate showing an enlarged view of a variant projection electrode.

As illustrated in FIG. 3, the variant projection electrode 11 has a circular shape in planar view, is set to have a larger outer diameter A1 at the upper end than an outer diameter A2 at the lower end, and has an overall reverse trapezoidal shape in cross-section. In other words, the variant projection electrode 11, when the cross-section cut in the height direction is viewed from the plane direction, has a reversed taper shape where both side edges approach each other as the edges go to the lower end. Furthermore, the outer diameter A1 at the upper end of the respective variant projection electrodes 11 is set to be from 70 µm to 180 µm (110 µm in the present embodiment) and the outer diameter A2 at the lower end of the respective variant projection electrodes 11 is set to be from 60 µm to 120 µm (80 µm in the present embodiment). That is, in the variant projection electrode 11, the outer diameter A1 at the upper end is set to be from 1.1 times to 2.0 times (1.3 times in the present embodiment) the outer diameter A2 at the lower end. In addition, the height of the variant projection electrodes 11 is set to be 40 µm.

As illustrated in FIG. 3, the variant projection electrode 11 has the recess portion 13 on the upper surface 12. The recess portion 13 has a mortar shape and the entire inner surface has a curved surface shape. Then, the deepest portion of the recess portion 13 is positioned on a center axis C1 of the variant projection electrode 11. The "center axis C1" represents an axial line penetrating the central spot of the variant projection electrode 11 in planar view. In addition, the depth of the recess portion 13 is equal to or more than 1 percent of the height (40 µm) of the variant projection electrode 11, is from one tenth to one third of the height of the variant projection electrode 11, and is set to be 8 µm in the present embodiment. Furthermore, the variant projection electrode 11 has the curved portion 15 at the boundary area between the upper surface 12 and the lateral surface 14. The radius of the curved portion 15 is set to be 0.5 µm or more (1.0 µm in the present embodiment).

In addition, each variant projection electrode 11 is configured of a copper layer, a nickel layer, a palladium layer and a gold layer. The copper layer is a plated layer formed by coating a first substrate main surface 102 using electroless copper plating and copper electroplating. The nickel layer is the plated layer formed by coating the surface of the copper layer which is exposed via an opening 46 of a solder resist 45 to be described later, using nickel electroplating. The palladium layer is the plated layer formed by coating the surface of the nickel layer using palladium electroplating. The gold layer is the plated layer formed by coating the surface of the palladium layer using gold electroplating.

In addition, as illustrated in FIG. 1, the surface (first substrate main surface 102) of the resin insulation layer 44 is almost entirely covered by the solder resist 45. The opening 46 which exposes the respective variant projection electrodes 11 is formed at the solder resist 45. Furthermore, the respective variant projection electrodes 11 are connected to a connecting terminal 132 arranged at the bottom surface of an IC chip 131 (component) which has a rectangular flat board shape, via a solder bump 130. That is, the solder bump 130 is a so-called C4 bump used in a flip chip interconnection with the connecting terminal 132 of the IC chip 131.

Then, an under filling 134 is filled in the clearance between the first substrate main surface 102 and the IC chip 131. As a result, the coreless wiring substrate 101 and the IC chip 131 are fixed to each other in a state of sealing the clearance. In addition, the under filling 134 of the present embodiment is formed from epoxy resin which has thermal expansion coefficient of approximately 20 to 60 ppm/° C. (specifically, 34 ppm/° C.).

Next, a method of manufacturing the coreless wiring substrate 101 will be described.

Figure 4:
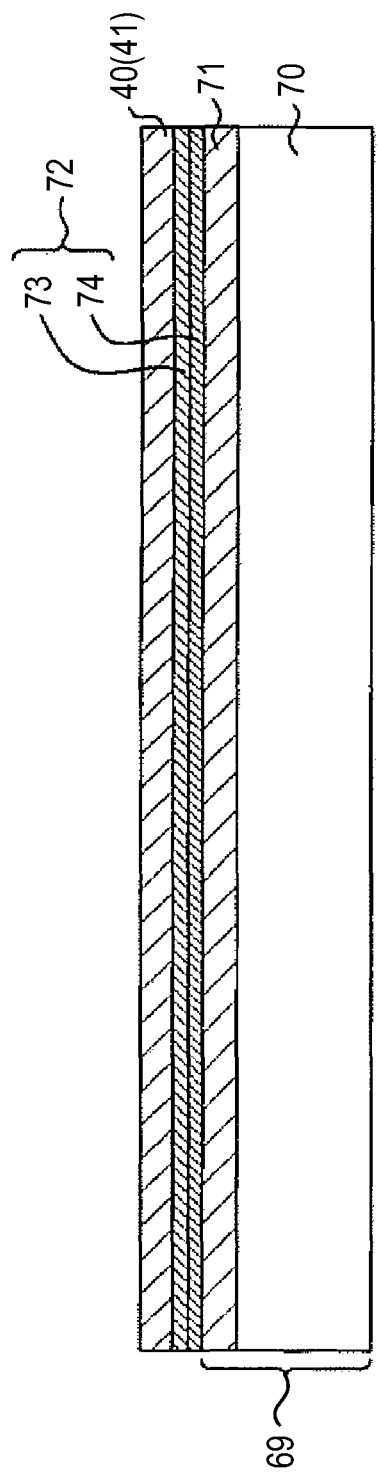
FIG. 4 is an explanatory view illustrating a manufacturing method of a coreless wiring substrate.

In a step of preparing a multilayer portion, a multilayer portion 80 which is to become an intermediate product of the coreless wiring substrate 101 is manufactured and prepared in advance. In addition, the intermediate product of the coreless wiring substrate 101 has a structure where product units which are to become the coreless wiring substrate 101 are plurally arranged along the plane direction. The intermediate product of the coreless wiring substrate 101 is manufactured in the following manner. First, a supporting substrate 70 having a sufficient strength, such as a glass epoxy substrate, is prepared (refer to FIG. 4). Next, a base member 69 formed from the supporting substrate 70 and a resin insulation base layer 71 is obtained in such a manner that a sheet-like insulation resin base member formed from epoxy resin is stuck in a half-hardening state and the resin insulation base layer 71 is formed on the supporting substrate 70 (refer to FIG. 4). Then, a layered metal sheet body 72 is arranged on one surface (specifically, the upper surface of the resin insulation base layer 71) of the base member 69 (refer to FIG. 4). Here, since the layered metal sheet body 72 is arranged on the resin insulation base layer 71 in the half-hardening state, the layered metal sheet body 72 comes to have secured adhesion to such an extent as not to be detached from the resin insulation base layer 71 during the next manufacturing processes. The layered metal sheet body 72 is made by adhering two sheets of copper foil 73 and 74 in a detachable state. More specifically, the layered metal sheet body 72 is formed by layering the respective copper foils 73 and 74 via metal plating (for example, chrome plating).

Figure 5:
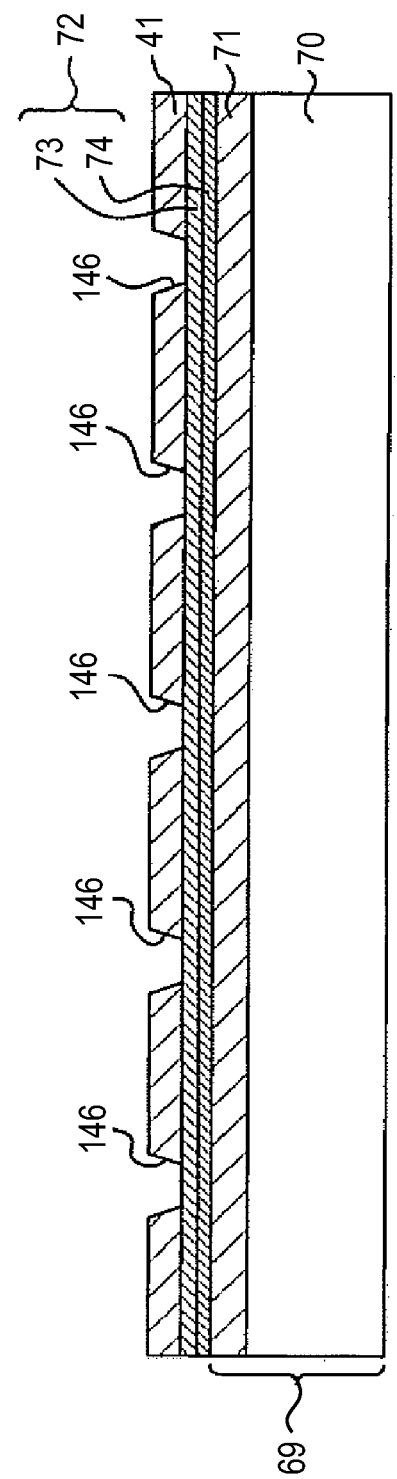
FIG. 5 is an explanatory view illustrating a manufacturing method of a coreless wiring substrate.
Figure 6:
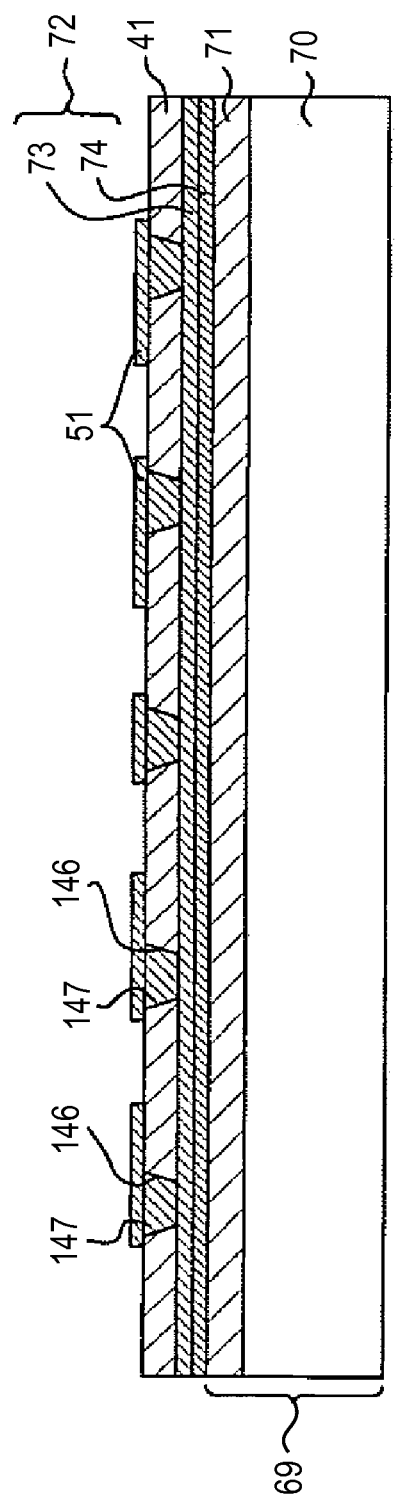
FIG. 6 is an explanatory view illustrating a manufacturing method of a coreless wiring substrate.

Then, a sheet-like insulation resin base member 40 is layered on the layered metal sheet body 72, and both are heated and pressurized in a vacuum state using a vacuum crimp thermal press machine (not illustrated). Thereby, the first layer, a resin insulation layer 41 is formed by hardening the insulation resin base member 40 (refer to FIG. 4). Then, as illustrated in FIG. 5, via holes 146 are formed at predetermined positions of the resin insulation layer 41 by laser beam machining and then desmear treatment is performed in order to remove smear inside the respective via holes 146. Thereafter, via conductors 147 are formed inside the respective via holes 146 using electroless copper plating and copper electroplating according to the well-known technique in the related art. In addition, the pattern of the conductor layers 51 (refer to FIG. 6) is formed on the resin insulation layer 41 by etching according to the well-known technology in the related art (for example, semi-additive process).

Figure 7:
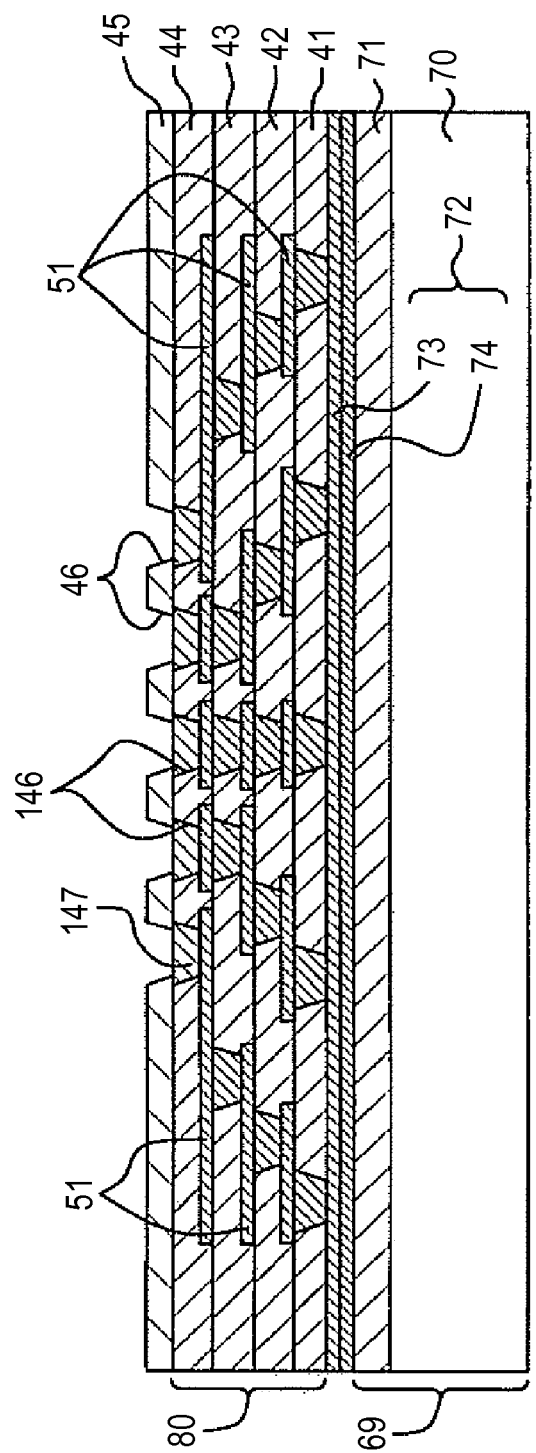
FIG. 7 is an explanatory view illustrating a manufacturing method of a coreless wiring substrate.

In addition, the second to the fourth layers, the resin insulation layers 42 to 44, and the conductor layer 51 are formed in the same manner as the above-described resin insulation layer 41 and the conductor layer 51 and are continuously layered on the resin insulation layer 41. Then, photosensitive epoxy resin is coated and hardened on the resin insulation layer 44 (top-most resin insulation layer), and thereby the solder resist 45 is formed. Next, patterning of the opening 46 is performed on the solder resist 45 by performing exposure and development in a state of arranging a predetermined mask. According to the above manufacturing processes, a multilayer portion 80 formed by layering the layered metal sheet body 72, resin insulation layers 41 to 44 and the conductor layers 51 on the supporting substrate 70 is formed (refer to FIG. 7). Furthermore, as illustrated in FIG. 7, a region positioned on the layered metal sheet body 72 in the multilayer portion 80 becomes the multilayer portion 80 which is to become the intermediate product of the coreless wiring substrate 101.

Figure 8:
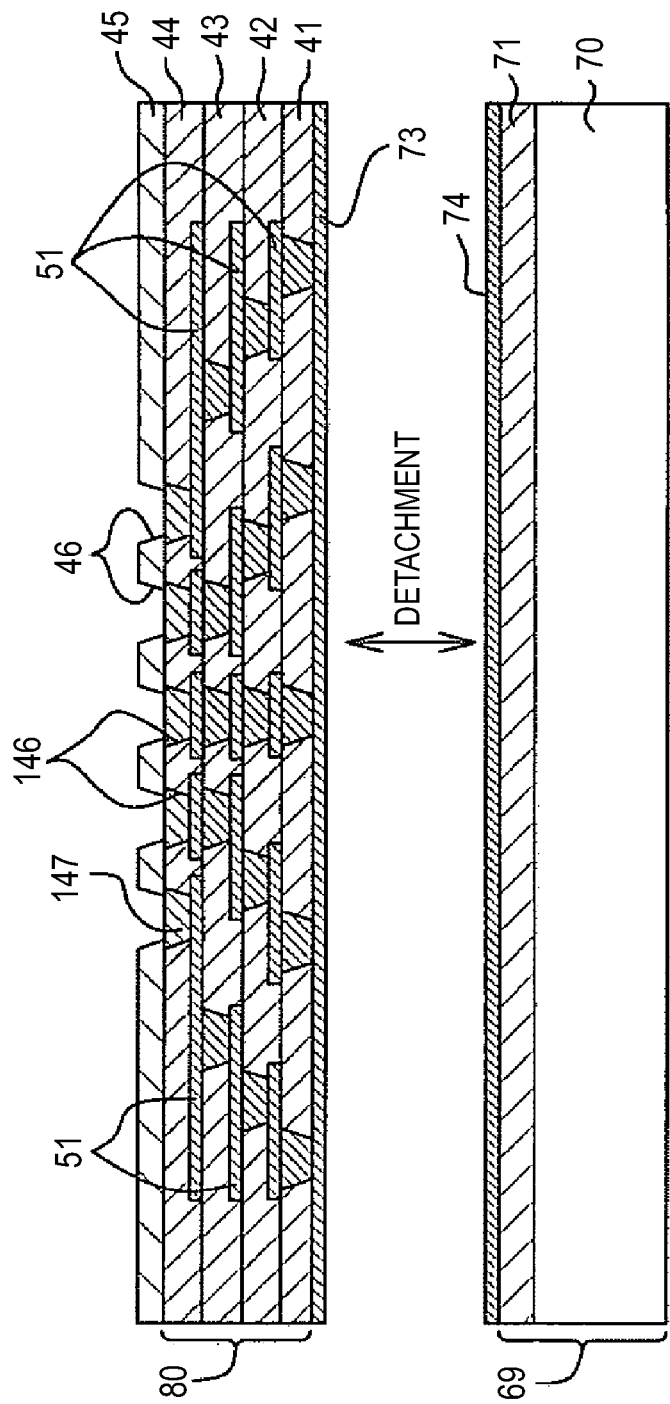
FIG. 8 is an explanatory view illustrating a manufacturing method of a coreless wiring substrate.
Figure 9:
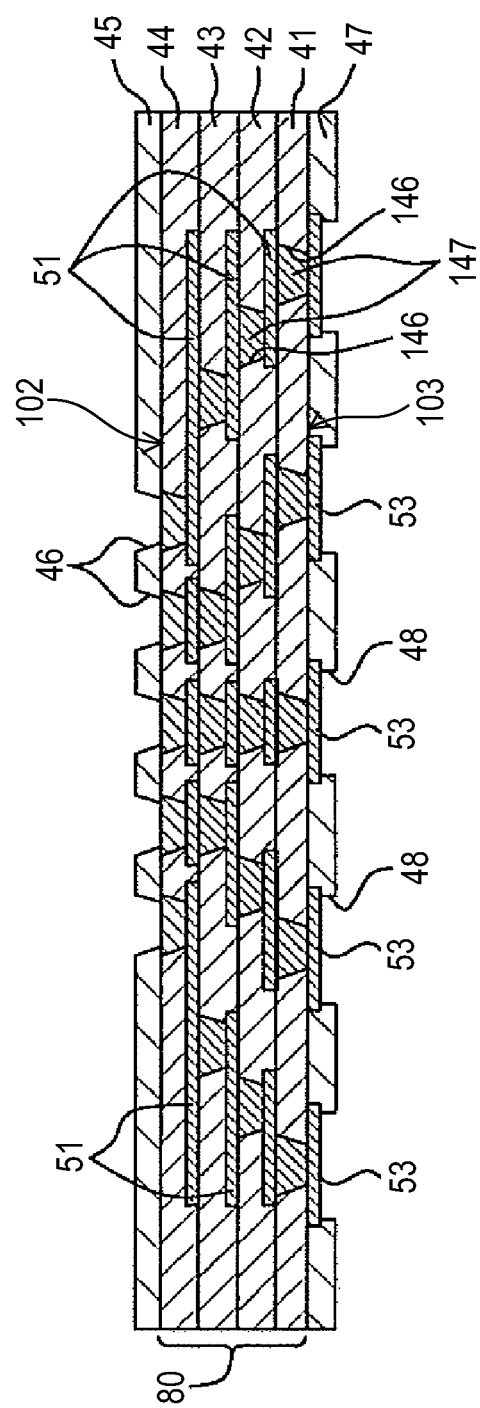
FIG. 9 is an explanatory view illustrating a manufacturing method of a coreless wiring substrate.

Next, the base member 69 is removed to expose a copper foil 73. More specifically, interfaces of two sheets of the copper foil 73 and 74 in the layered metal sheet body 72 are detached and the multilayer portion 80 is separated from the supporting substrate 70 (refer to FIG. 8). Then, patterning is performed by etching with respect to the copper foil 73 positioned on a second substrate main surface 103 (lower surface) of the multilayer portion 80 (resin insulation layer 41). In this manner, BGA pads 53 are formed at the region on the second substrate main surface 103 in the resin insulation layer 41 (refer to FIG. 9). Thereafter, photosensitive epoxy resin is coated and hardened on the resin insulation layer 41 where the BGA pads 53 are formed, and thereby a solder resist 47 is formed so as to cover a second substrate main surface 103 of the multilayer portion 80 (refer to FIG. 9). Next, exposure and development are performed in a state of arranging a predetermined mask, and thereby patterning of an opening 48 is performed at the solder resist 47.

Figure 10:
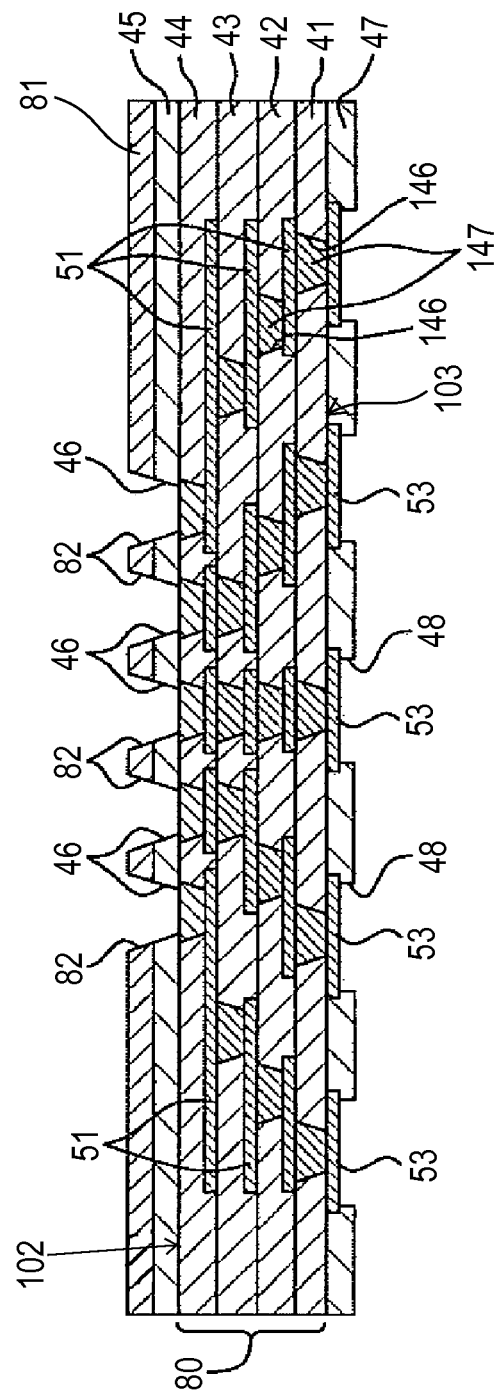
FIG. 10 is an explanatory view illustrating a manufacturing method of a coreless wiring substrate.

Next, a step of forming a resist is performed. Specifically, a dry film is laminated on the top layer, the resin insulation layer 44 which has the first substrate main surface 102, more specifically on the surface of the solder resist 45, and a plating resist 81 (refer to FIG. 10) is formed. In the succeeding step of forming an opening, laser beam machining is performed with respect to the plating resist 81 using a laser beam machine. As a result, an opening 82 which is set to have a larger inner diameter at the upper end side opening than the inner diameter at the lower end side opening and which is set to have the equal inner diameter at the lower end side opening to the inner diameter of the upper end side opening of the opening 46, is formed at the position which communicates with the opening 46 of the solder resist 45 (refer to FIG. 10). Furthermore, the inner diameter of the lower end side opening of the opening 82 may be set to be larger than the inner diameter of the upper end side opening of the opening 46.

In the succeeding step of forming the variant projection electrode, plating is performed with respect to the inner side of the opening 82. Thereby, the variant projection electrode 11 is formed at the opening 82. More specifically, first, copper electroplating is performed and then a copper layer is formed with respect to the upper end surface of a via conductor 147 exposed to the inner surface of the opening 82 and the first substrate main surface 102. Next, nickel electroplating is performed and thereby a nickel layer is formed on the surface of the copper layer exposed via the opening 46 of the solder resist 45. Furthermore, strike palladium electroplating and palladium electroplating are performed to form the palladium layer on the nickel layer. The palladium layer may be formed by performing only the strike palladium electroplating. Then, the gold layer is formed on the palladium layer by performing the gold electroplating. Here, the thickness of the copper layer is set to be approximately 40 μm and the thickness of the nickel layer, the palladium layer and the gold layer is set to be from 0.01 μm to 15 μm. In addition, in the present embodiment, the copper layer, the nickel layer, the palladium layer and the gold layer are formed by electroplating, but can be formed using another method such as the electroless plating, a sputtering method or CVD method. However, it is preferable to form the copper layer by plating in order to obtain a height (approximately 40 μm) required particularly for the copper layer.

In addition, in the present embodiment, the recess portion 13 is formed on the upper surface 12 of the variant projection electrode 11 by adjusting the plating condition, at the time when the gold layer is formed. More specifically, first, the lower side portion of the copper layer is formed under the common plating condition. Then, the upper side portion of the copper layer is formed under a plating condition different from the common plating condition. As the method of changing the plating condition, for example, decreasing the mixing amount for the plating in a plating bath, increasing or decreasing the amount of brightener which is to be contained in the plating, adding a weak acid (for example, sodium hypochlorite or the like) to the plating, or the like may be exemplified. That is, it may be considered that the plating condition may be changed on purpose to the condition which causes soldering defects, such as pits or irregularities. Furthermore, the recess portion 13 may be formed by pressing the summit of the variant projection electrode 11 using a pressing jig or may be formed by a cutting work using a cutter. In addition, the recess portion 13 may be formed by soft etching.

Figure 11:
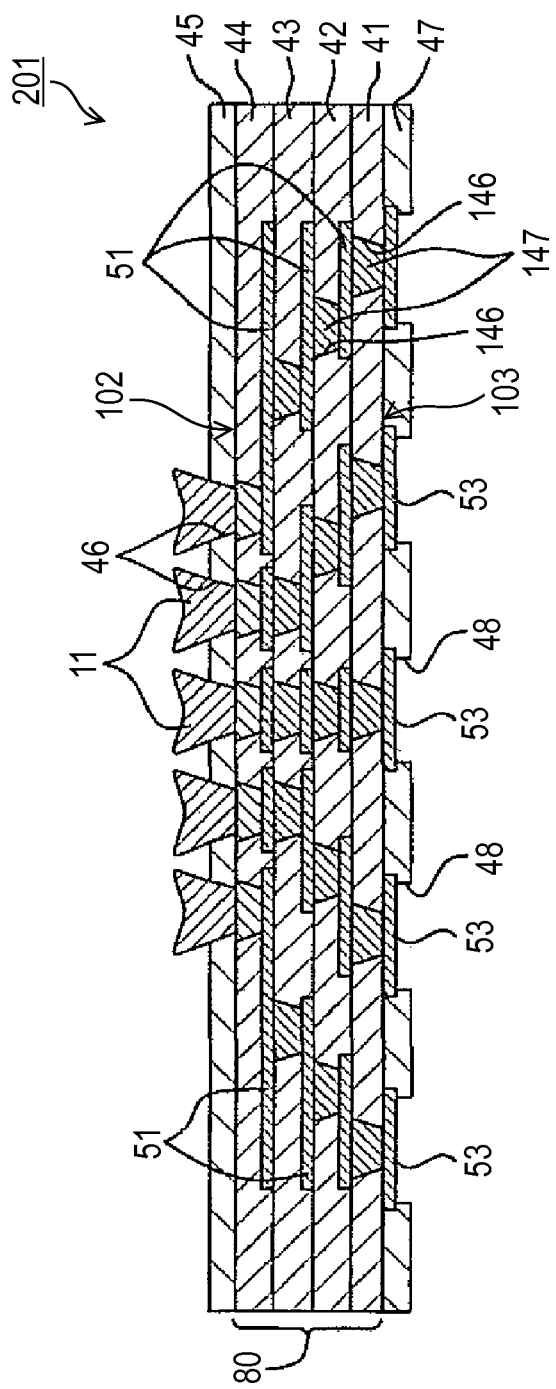
FIG. 11 is an explanatory view illustrating a manufacturing method of a coreless wiring substrate.

Then, a plating resist 81 is detached (refer to FIG. 11). In addition, in a step of forming the curved portion after the step of forming the variant projection electrode, the soft etching is performed with respect to the variant projection electrode 11. As a result, the curved portion 15 configured by the curved surface at the boundary area between the upper surface 12 of the variant projection electrode 11 and the lateral surface 14 of the variant projection electrode 11 is formed.

Next, solder bumps 155 are formed on a plurality of BGA pads 53 formed at the second substrate main surface 103 side of the multilayer portion 80. More specifically, solder balls are arranged on the respective BGA pads 53 using a solder ball mounting device (not illustrated) and then the solder balls are heated for reflow soldering at a predetermined temperature. Thus, the solder bumps 155 are formed on the respective BGA pads 53. In addition, at this time, the intermediate product of the coreless wiring substrate 101 is completed.

In the succeeding separation step, the intermediate product of the coreless wiring substrate 101 is divided using the well-known cutting machine in the related art. As a result, each product portion is divided and thereby the coreless wiring substrates 101 which are individual products can be plurally obtained at the same time (refer to FIG. 1).

Figure 12:
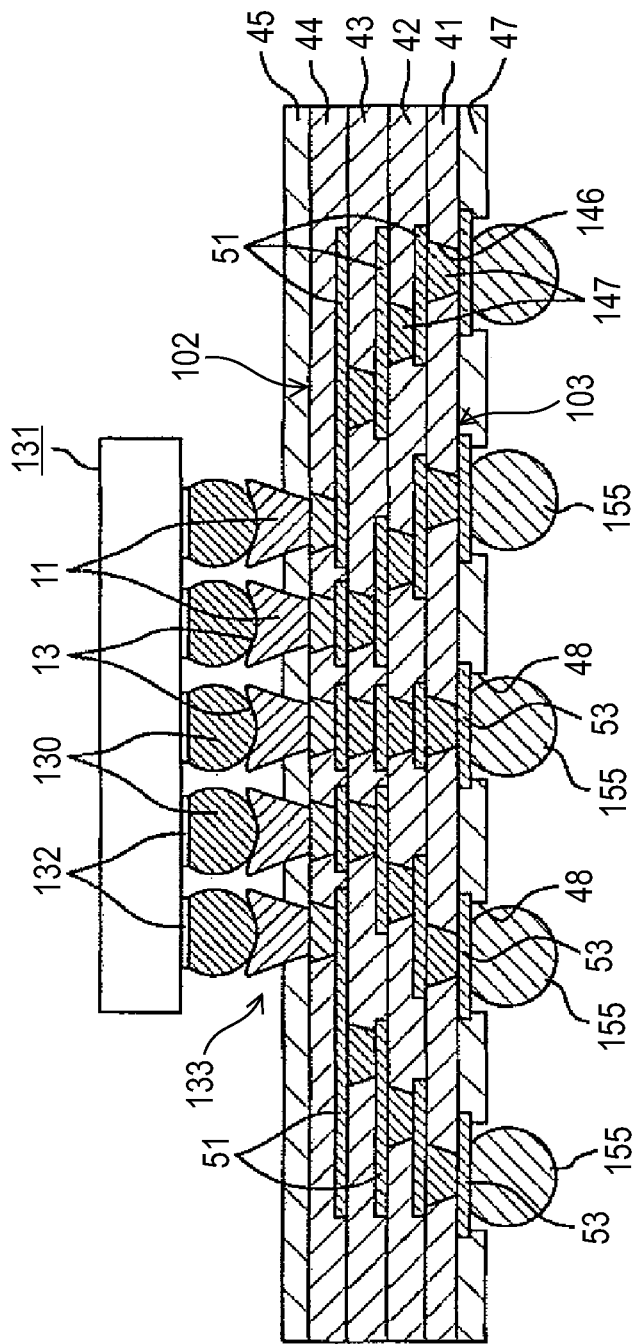
FIG. 12 is an explanatory view illustrating a manufacturing method of a coreless wiring substrate.

Thereafter, a step of mounting the IC chip is performed. More specifically, first, the IC chip 131 is placed in the electrode formation region 133 of the coreless wiring substrate 101 (refer to FIG. 12). At this time, the solder bumps 130 arranged at the bottom surface side of the IC chip 131 are placed on the recess portion 13 of the variant projection electrode 11 arranged at the coreless wiring substrate 101 side. Then, the respective solder bumps 130 are heated approximately to 230° C. to 260° C. and subjected to reflow soldering. Thereby, the variant projection electrode 11 is in the flip chip interconnection with respect to the connecting terminal 132 and the IC chip 131 is mounted on the coreless wiring substrate 101. In addition, the under filling 134 is filled in the clearance between the first substrate main surface 102 of the coreless wiring substrate 101 and the IC chip 131 and subjected to hardening treatment. Then, the clearance is sealed using resin.

Therefore, according to the present embodiment, the following advantages can be obtained.

(1) In the coreless wiring substrate 101 of the present embodiment, all the projection electrodes which are present in the electrode formation region 133 become the variant projection electrodes 11 which have the recess portions 13 on the upper surface 12. Consequently, if the solder bump 130 arranged at the bottom surface side of the IC chip 131 is placed on the variant projection electrode 11, at least a portion of the solder bump 130 is fitted into the recess portion 13 (refer to FIG. 12). As a result, since the solder bump 130 comes in contact with the inner surface of the recess portion 13, misalignment of the solder bump 130 is prevented. Accordingly, the IC chip 131 can be prevented in advance from falling away from a plurality of the variant projection electrodes 11 and consequently connection failure of the individual variant projection electrode 11 and the IC chip 131 can be prevented. That is, since the variant projection electrode 11 suitable for being connected to the IC chip 131 is provided, it is possible to improve the reliability of the coreless wiring substrate 101.

In addition, the outer diameter A1 at the upper end of the variant projection electrode 11 is set to be larger than the outer diameter A2 at the lower end of the variant projection electrode 11. Therefore, it becomes easy to secure the contact area between the variant projection electrode 11 and the solder bump 130 of the IC chip 131 side. As a result, the misalignment of the solder bump 130 can be more reliably prevented and thereby it is possible to further improve the reliability of the coreless wiring substrate 101.

(2) In the present embodiment, all the projection electrodes which are present within the electrode formation region 133 become the variant projection electrodes 11. In this case, since the misalignment of a plurality of the solder bumps 130 is prevented by the multiple variant projection electrodes 11, the IC chip 131 can be reliably prevented from falling away from a plurality of the variant projection electrodes 11.

(3) The variant projection electrode 11 of the present embodiment has a reverse trapezoidal shape in cross-section as a whole, and is set to have the larger outer diameter A1 at the upper end than an outer diameter at the upper end of the opening 46 of the solder resist 45. As a result, even if the solder resist 45 is detached, the detachment is suppressed by being caught by the variant projection electrode 11. Accordingly, the reliability on the coreless wiring substrate 101 is further improved.

(4) In the present embodiment, when the cross-section where the variant projection electrode 11 is cut in the height direction is viewed from the plane direction, a side configuring the lateral surface 14 is linear. As a result, when the cross-section where the plating resist 81 is cut in the thickness direction is viewed from the plane direction, the opening 82 of the plating resist 81 used for forming the upper portion of the variant projection electrode 11 is configured such that a connecting line from the opening end at the upper end side and the opening end at the lower end side of the opening 82 is linear (refer to FIG. 10). In addition, when the cross-section where the solder resist 45 is cut in the thickness direction is viewed from the plane direction, the opening 46 of the solder resist 45 used for forming the lower portion of the variant projection electrode 11 is also configured such that a connecting line from the opening end at the upper end side and the opening end at the lower end side of the opening 46 is linear (refer to FIG. 10). As a result, since the openings 46 and 82 have a shape for easy laser beam machining, it is easy to form the variant projection electrode 11 and consequently to form the coreless wiring substrate 101.

In addition, the present embodiment may be modified as follows.

In the above-described embodiment, when the cross-section where the variant projection electrode 11 is cut in the height direction is viewed from the plane direction, the side configuring the lateral surface 14 is linear, but the upper portion of the side configuring the lateral surface 14 may have a curved line shape.

Figure 13:
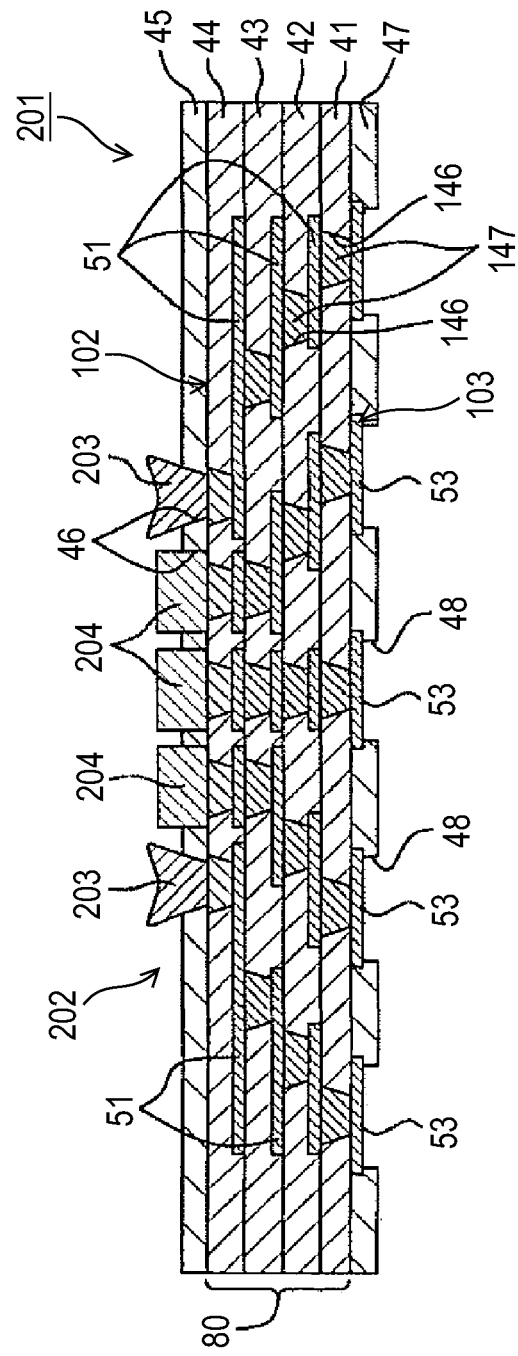
FIG. 13 is a schematic cross-sectional view illustrating a configuration of a coreless wiring substrate according to another embodiment.
Figure 14:
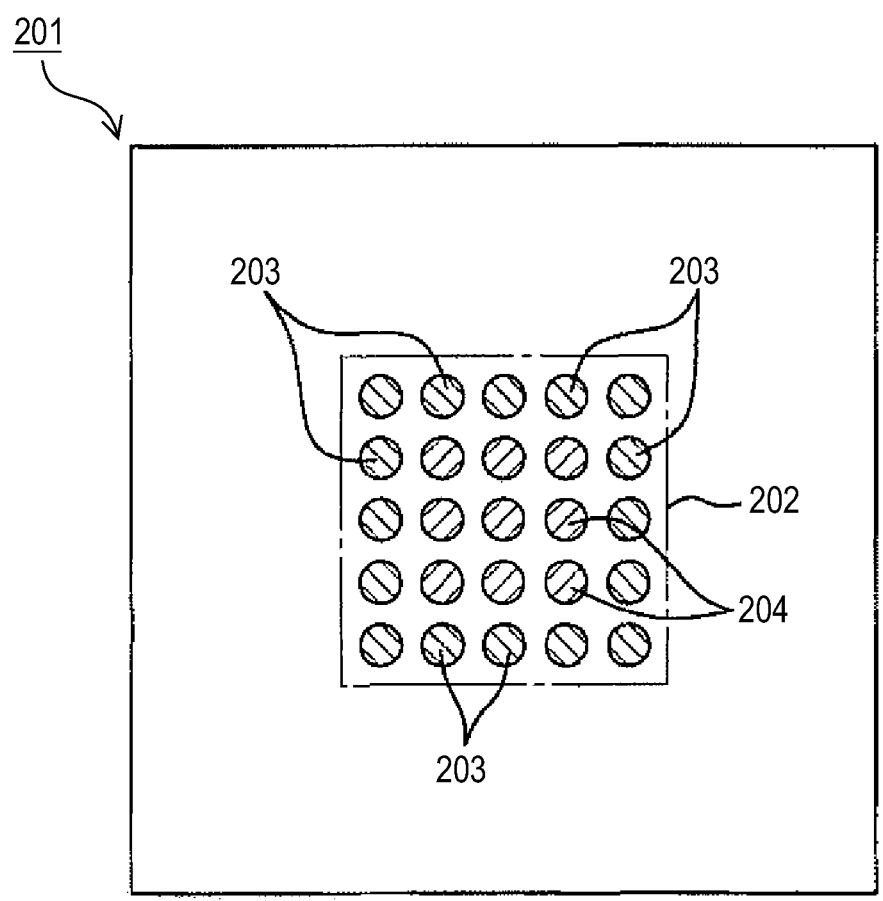
FIG. 14 is a schematic plan view illustrating a coreless wiring substrate according to another embodiment.

In the above-described embodiment, all the projection electrodes which are present within the electrode formation region 133 become the variant projection electrodes 11. However, as a coreless wiring substrate 201 illustrated in FIGS. 13 and 14, only the projection electrode positioned at the outer periphery of an electrode formation region 202 among a plurality of the projection electrodes may be a variant projection electrode 203. In addition, a projection electrode 204 positioned at the region other than the outer periphery of the electrode formation region 202 is a columnar electrode which is set such that the outer diameter at the upper end is equal to the outer diameter at the lower end. Therefore, it is possible to form the projection electrode 204 to be smaller than the variant projection electrode 203. Accordingly, it is possible to further miniaturize the pitch between the projection electrodes.

In the coreless wiring substrate 101 of the above described embodiment, the variant projection electrode 11 is formed only on the first substrate main surface 102, but is not limited thereto. For example, the variant projection electrode 11 may be formed on both the first substrate main surface 102 and the second substrate main surface 103.

In the above-described embodiment, the package form of the coreless wiring substrate 101 is a BGA (ball grid array), but is not limited only to the BGA. For example, a PGA (pin grid array), an LGA (land grid array) or the like may be used.

Thus, the above-described embodiment can provide a wiring substrate where a plurality of projection electrodes are arranged within an electrode formation region on a substrate main surface. At least one among a plurality of the projection electrodes has a recess portion on the upper surface, an outer diameter at the upper end is set to be larger than an outer diameter at the lower end, and is a variant projection electrode which has a reversed taper shape where both side edges approach each other as the edges go to the lower end, when the cross-section cut in the height direction is viewed from the plane direction. The depth of the recess portion can be from one tenth to one third of the height of the variant projection electrode.

What is claimed is:

1. A wiring substrate, comprising:
a multilayer portion that includes a plurality of interlayer insulation layers, each of the plurality of interlayer insulation layer including via holes having a reverse cone shape and via conductors formed in the via holes, a top-most interlayer insulation layer constituting a substrate main surface; and
a plurality of projection electrodes arranged within an electrode formation region on the substrate main surface, each of the plurality of projection electrodes directly formed on a respective via conductor in the reverse truncated cone shaped via hole of the top-most interlayer insulation layer;

wherein at least one among the plurality of projection electrodes comprises a variant projection electrode having a recess portion on an upper surface, an outer diameter at an upper end that is larger than an outer diameter at a lower end, and a reverse trapezoidal cross-section shape and a curved portion formed at a boundary area between the upper surface of the variant projection electrode and a lateral surface of the variant projection electrode.

2. The wiring substrate according to claim 1, wherein an entire inner surface of the recess portion has a curved surface shape and a deepest portion of the recess portion is positioned on a center axis of the variant projection electrode.

3. The wiring substrate according to claim 1, wherein all of the plurality of projection electrodes which are present within the electrode formation region comprise variant projection electrodes.

4. The wiring substrate according to claim 1, wherein the plurality of projection electrodes are arrayed in vertical and horizontal rows along a surface direction of the substrate main surface within the electrode formation region, and
wherein, among the plurality of projection electrodes, projection electrodes positioned at an outer periphery of the electrode formation region comprise variant projection electrodes.

5. The wiring substrate according to claim 1, wherein the variant projection electrode is in a flip chip interconnection with a plurality of connecting terminals positioned at a bottom surface side of a component via a solder bump placed on the recess portion.

6. A method of manufacturing the wiring substrate according to claim 1, comprising:
preparing a multilayer portion formed by layering a plurality of interlayer insulation layers;
forming a resist on a top-most interlayer insulation layer that forms a substrate main surface;
forming an opening on the resist which has a larger inner diameter at an upper end side of the opening than an inner diameter at a lower end side of the opening; and
forming a variant projection electrode, which has a recess portion on an upper surface, at the opening by plating the inner side of the opening.

7. The method of manufacturing the wiring substrate according to claim 6, further comprising:
forming a curved portion at a boundary area between the upper surface of the variant projection electrode and a lateral surface of the variant projection electrode by etching the variant projection electrode after forming the variant projection electrode.

* * * * *